United States Patent [19]
Duchemin et al.

[11] Patent Number: 5,978,396
[45] Date of Patent: Nov. 2, 1999

[54] SEMICONDUCTOR LASER SOURCE

[75] Inventors: Jean Pascal Duchemin, Gif S/Yvette; Eugène Leliard, Puiseaux; Eric Brousse, Lisses; Thierry Fillardet, Morigny-Champigny, all of France

[73] Assignee: Thomson-CSF, Paris, France

[21] Appl. No.: 08/793,749

[22] PCT Filed: Jul. 5, 1996

[86] PCT No.: PCT/FR96/01052

§ 371 Date: Mar. 13, 1997

§ 102(e) Date: Mar. 13, 1997

[87] PCT Pub. No.: WO97/03487

PCT Pub. Date: Jan. 30, 1997

[30] Foreign Application Priority Data

Jul. 13, 1995 [FR] France .................................. 95 08507

[51] Int. Cl.⁶ ................................ H01S 3/18; H01S 3/04
[52] U.S. Cl. ............................................. 372/43; 372/36
[58] Field of Search ................................ 372/34, 36, 43, 372/50, 69, 75, 109

[56] References Cited

U.S. PATENT DOCUMENTS 3,835,414  9/1974  Ahearn ........................................ 372/43
5,016,083  5/1991  Ishii et al. ................................... 372/34

FOREIGN PATENT DOCUMENTS 59-165473  9/1984  Japan.

Primary Examiner—Rodney Bovernick
Assistant Examiner—Quyen Phan Leung
Attorney, Agent, or Firm—Oblon, Spivak McClelland, Maier & Neustadt, P.C.

[57] ABSTRACT

A semiconductor laser source, including a stack of semiconductor laser diodes each including at least one active region. The active region includes a series of semiconductor layers located between an ohmic contact layer and a substrate which also assumes the function of an ohmic contact layer. Pressure keeps the diodes in contact with one another by way of their ohmic contact layers. Each diode has dimensions, especially in their thickness, so that the transient heating in each diode is as small as possible and so that the average heating in the stackable diodes does not exceed a predetermined value.

22 Claims, 7 Drawing Sheets

SEMICONDUCTOR LASER SOURCE

BACKGROUND OF THE INVENTION

1. Field of the Invention

The invention relates to a semiconductor laser source and, in particular, to a structure of elementary modules assembled by mechanical clamping.

2. Discussion of the Background

Since the 1970s, it has been proposed to exploit the advantageous properties of laser diodes (ease of fast direct modulation, high efficiency in the conversion of electrical energy into light energy in a narrow spectral band etc.) to produce devices capable of generating high power densities per unit area. To this end, monolithic elementary laser diodes were assembled by soldering in the form of stacks, as schematized in FIG. 1 in the case of four elementary diodes. It can be seen that, all other things being equal, the emitted power density is inversely proportional to the height H of the elementary diode.

Devices of this type were marketed in the 1970's by the company Laser Diode Laboratories, with a number of variants, differing by the number of stacked elements and the number of assembled stacks. The elementary laser diodes were single-heterojunction diodes which had a threshold current density of the order of $10^4$ A/cm$^2$, which entailed operation in short pulses (typically 100 ns) with low recurrence frequencies (typically 1 kHz). Assemblies of this type could deliver peak powers of several kW; one intended application, among others, was the pulsed illumination of scenes in the near infrared.

The development of quantum-well laser diodes in the 1980s made it possible to improve considerably their properties, threshold current and differential efficiency, and consequently to increase the energy conversion efficiency, which may be up to 50% in long pulse operation (several hundreds of $\mu$s) or in continuous operation.

These new characteristics have stimulated the application of laser diodes to the pumping of solid-state lasers, in particular YAG:Neodymium lasers, by replacing flash or other lamps, with an increase in the "take-up" efficiency of these lasers by a factor of more than 10. This increase is essentially due to the small spectral width (3 nm) of the laser diodes, compared with that of "white" sources. The typical operating mode, referred to as "quasi-continuous" or QCW, consists of "long" pulses (a few hundred $\mu$s), and it is also beneficial to increase the recurrence frequency beyond the 100 Hz obtained with flash lamps. Products are marketed, for example by the company Spectra Laser Diodes, in the form of hybrid stacks as described in the document J. G. Endriz et al., High power diode laser arrays, IEEE J. Quantum Electron., 28(4), 952–965, April 1992, the design of which has the clear aim of allowing operating at High frequency, and consequently at high mean power. To this end, monolithic diodes in arrays, typically of 1 cm width, are soldered onto supports made of a material with high thermal conductivity, in the form of elementary modules which are themselves assembled by soldering on a common support, in a number depending on the power to be obtained, and are electrically connected in series.

This type of assembly has two drawbacks:
- the cost of the assembly is high;
- the emitted power density is geometrically limited by the height of an elementary module.

The object of the invention is firstly to overcome the drawback of the cost for certain applications, pumping solid-state lasers, which require large numbers of stacks and will consequently be economically viable only with a substantial reduction in the fabrication costs, but do not require pulsed operation whose recurrence rate is high. The invention furthermore has the advantage of allowing an increase in the power density emitted.

The cost can be analyzed into two components.

1. The "front end", all the collective technologies (material epitaxy, microlithography, electrical contact metallization), has a cost per elementary device which decreases very rapidly as the quantities produced increase, as found throughout the history of silicon technology. This will inevitably be the case for diode laser arrays.

2. The cost of the "back end", all the assembly and encapsulation technologies, therefore becomes increasingly dominant as the functions fulfilled become more complex. This is the case for the stacks marketed today.

SUMMARY OF THE INVENTION

The invention therefore aims to reduce the cost of the assembly by simplifying and optimizing the elementary modules, and by simplifying their assembly. It has the advantage of reducing the height H of the elementary module, and consequently of allowing an increase in the peak power density emitted in pulsed mode.

The invention therefore relates to a semiconductor laser source, including a stack of semiconductor laser diodes, each including at least one active region consisting of a series of semiconductor layers located between an ohmic contact layer and a substrate which also assumes the function of an ohmic contact layer, characterized in that it includes pressure means which keep the diodes in contact with one another via their ohmic contact layers.

BRIEF DESCRIPTION OF THE DRAWING

The various subjects and characteristics of the invention will emerge more clearly from the following description and from the appended figures, in which.

DISCUSSION OF THE PREFERRED EMBODIMENTS

Figure 1:
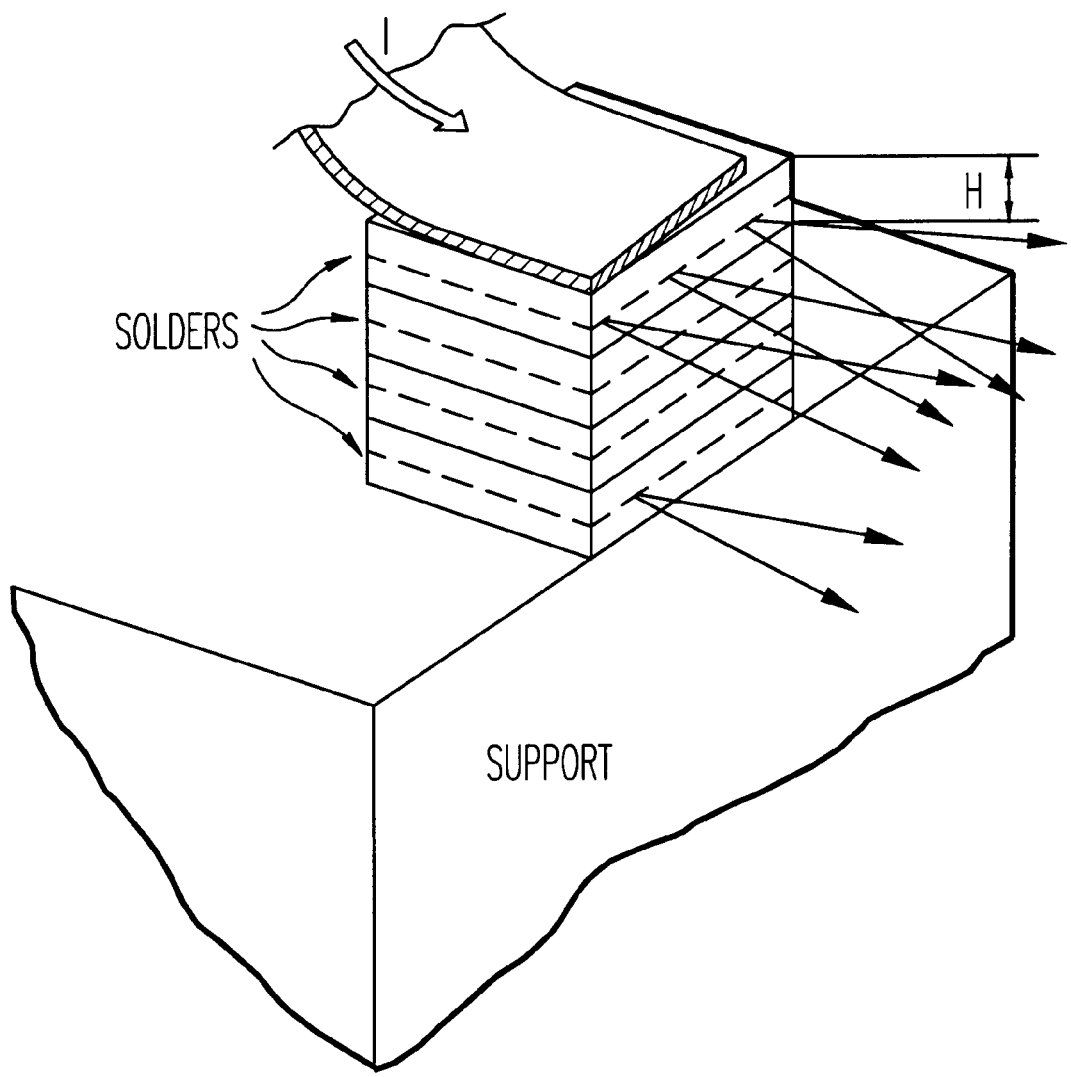
FIG. 1 represents a stack of laser diodes according to the prior art.
Figure 2:
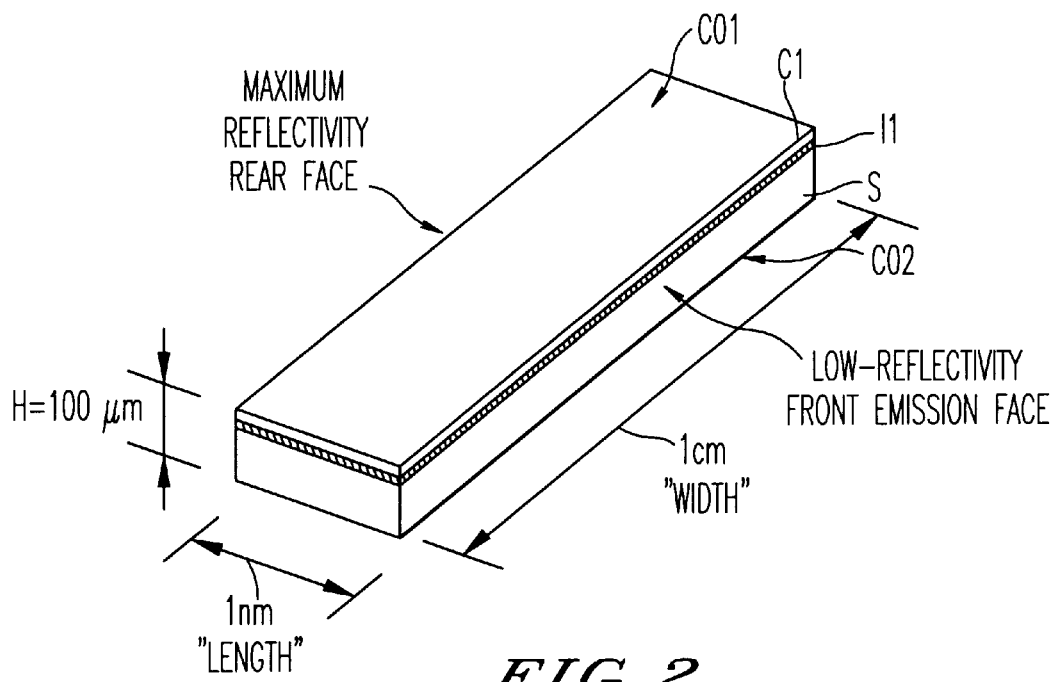
FIG. 2 represents a simple module of a laser diode.
Figure 3:
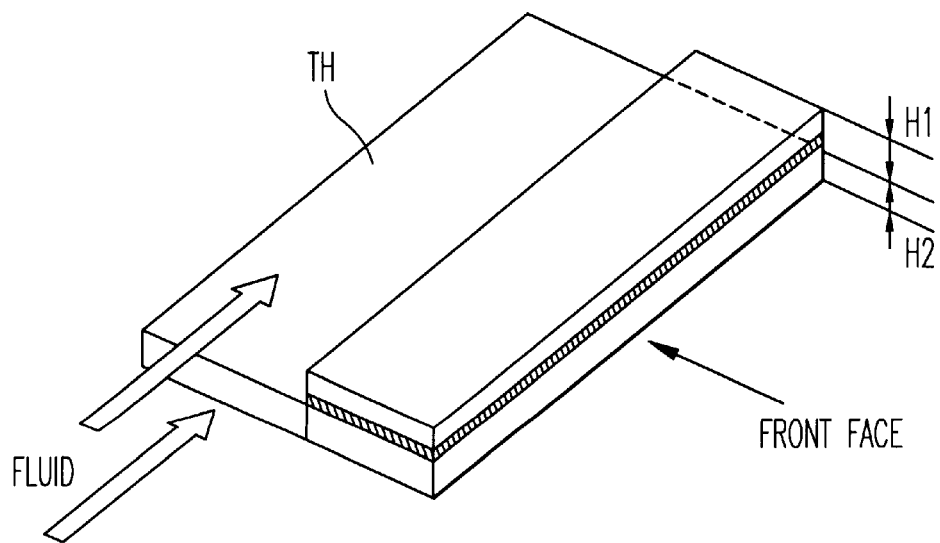
FIG. 3 represents a laser diode module with which a thermal dissipation sheet is associated.
Figure 4:
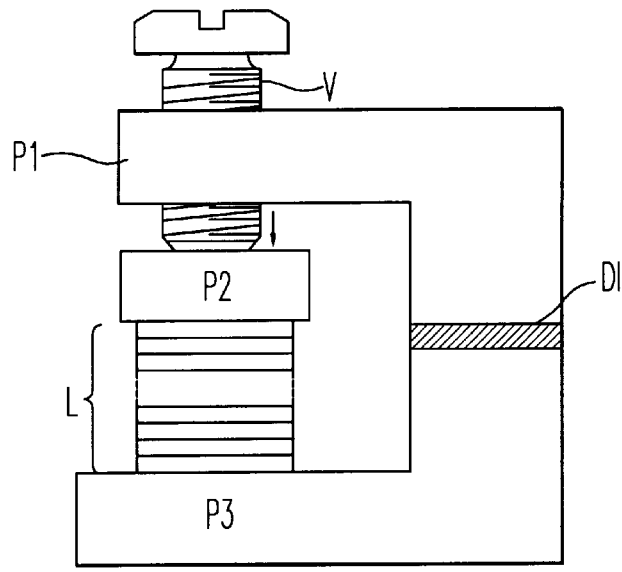
FIG. 4 represents a simplified illustrative embodiment of a stack of laser diodes according to the invention.

With reference to FIGS. 2 to 4, the structure of an illustrative embodiment of a stack of laser diodes according to the invention will therefore be described.

The elementary laser diodes used in the context of the invention are modules which are simplified compared to those used in the prior art.

According to FIG. 2, a laser diode includes simply a monolithic semiconductor array dimensioned as will be described below. This structure will be denoted as a "simple modules". An array of this type includes, on a substrate S of semiconductor material, an active region L1 which consists of a series of layers and is covered with an ohmic contact layer C1. The substrate S may also fulfill the role of an ohmic contact layer.

According to FIG. 3, the semiconductor array is associated with a thermal dissipator TH, which is in the form of a sheet with high electrical and thermal conductivities (made of semiconductor material, silicone, silicon carbide). Its dimensions and its characteristics will be described below. This structure will be denoted as a "hybrid module". The dissipation sheet TH has an area which is much greater than that of the module, so as to make it possible to remove heat out from the module.

In a preferred embodiment, the main faces of the arrays are covered with layers of gold C01, C02 (for example electrolytic gold).

According to the invention, a number of modules such as the ones in FIG. 2 or FIG. 3 are stacked to form a laser source L, as represented in FIG. 4. They are held by clamping between two conductive parts P2 and P3. The part P2 is pressed against the laser L by the screw V which bears on the part P1. The parts P1 and P3, and therefore the parts P2 and P3, are electrically isolated from one another by an insulator DI.

The parts P2 and P3 therefore make it possible to supply the excitation current to the stack L of laser diodes.

A number of variants may be envisaged regarding the means for clamping the stack L.

The gold layers previously provided on the main faces of the modules allow better contact between the modules. The latter are therefore not soldered together.

During mounting, the parts P2 and P3 are separated, and the pretested elementary modules are successively inserted into position, then the jaws are tightened and the modules are both held mechanically and electrically connected so as to be supplied in series. This device has the advantage that it can be disassembled for possible modular replacement. The geometry of the jaws may be designed so as to position the modules parallel by their rear face bearing on suitable stops.

Figure 5:
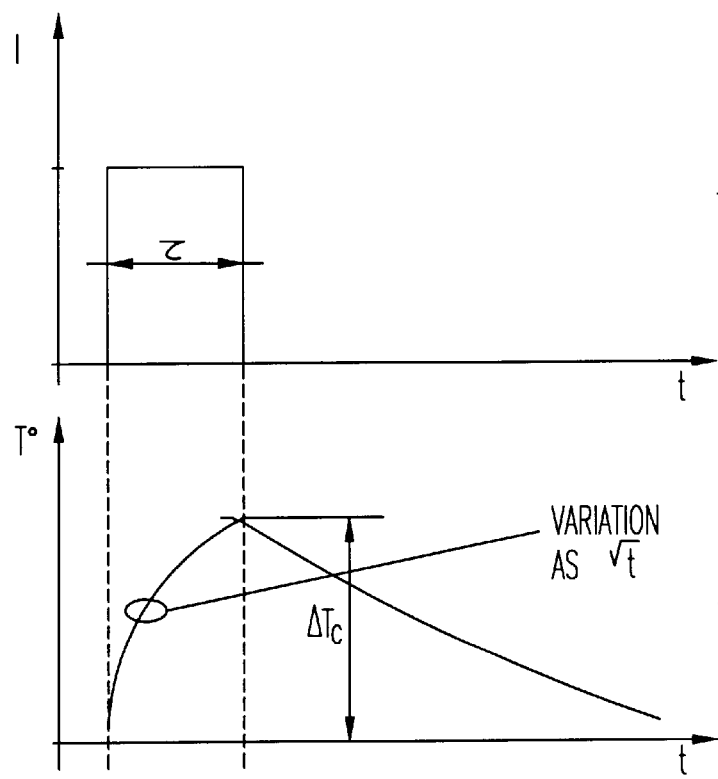
FIGS. 5a–5b represents curves of variations, as a function of time, of the current injected into a laser diode and of the variation in temperature of the active region of the diode.

Solid-state laser pumping applications require that the selected operating mode does not lead to spectral broadening greater than the width of the useful absorption band of the ion used, for example 3 nm for the neodymium ion in the YAG. However, the wavelength emitted by a laser diode varies with the temperature of its active region with a coefficient whose order of magnitude is $$d\lambda/dT=0.3 \text{ nm/}° C.$$

for the 808 nm wavelength used for the neodymium ion. FIG. 5 schematically represents the variations of the injected current (5a) and of the active region temperature (5b) for pulse mode excitation: from the above considerations, it results that the temperature excursion $\Delta T_c$ should not exceed 10° C. in the example chosen. The devices according to the invention are optimized to this end.

It is assumed that an active array consists of a substrate (for example GaAs) on which a set of epitaxial layers is deposited, which constitutes the active region and is optimized. The parameters to be determined are the thickness of the substrate of an active array, the nature and thickness of the thermal dissipator, in the case of a hybrid stack, as well as the number of modules.

The parameters characterizing the structure according to the invention will now be determined so as to satisfy mean and maximum transient heating temperatures.

A stack of modules is considered, which may be either simple modules, each consisting of a monolithic diode laser array;

or hybrid modules consisting of a diode laser array associated with a radiator array made of a thermally conductive material (silicone, silicon carbide, copper-tungsten, etc.).

A wedge, made of a suitable material, may be interposed between the upper face of the stack in order to symmetrize the assembly.

The outer faces of the extreme modules are assumed to be kept at a constant reference temperature.

Excitation Mode

The case of a pulsed mode with low duty ratio is addressed:

injected current of the order of 120 A, providing an optical power of 100 W per array, a maximum value which does not damage the device;

voltage of 2 V across the terminals of the active region of each array;

pulse duration of about 100 µs;

recurrence frequency of less than 100 Hz, so that the temperature has time to equilibrate in the structure between two successive pulses.

Mean temperature

Figure 8:
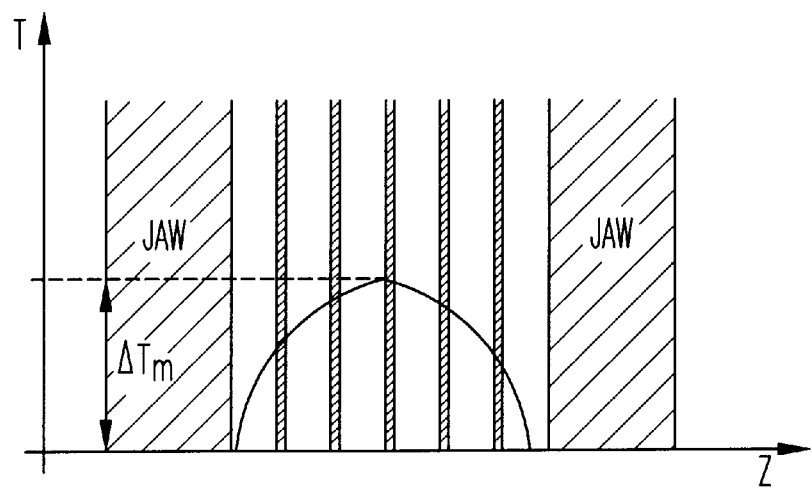
FIG. 8 represents a steady-state mean temperature profile in a laser diode stack according to the invention.

The steady-state mean temperature profile, along an axis perpendicular to the plane of the modules, is schematized in FIG. 8. An approximate expression may be given for $\Delta T_m$, the maximum value of this heating obtained at the centre of the structure, for a hybrid stack. This expression is valid so long as the number of modules is more than a few units:

$$\Delta T_m = F\tau f(H_1/K_1 + H_2/K_2)N(N+2)/8 \quad (1)$$

F: Peak heat flux generated in the active region of each array, for example 2 kW/cm2, corresponding to pulses with peak electrical power of 300 W, assuming an energy conversion efficiency of 33% and an array area of 0.1 cm².

τ: Duration of the pulses, for example 100 µs.

f: Repetition frequency of the pulses, for example 10 Hz.

$H_1$ and $H_2$: Respective thicknesses of an array and of the associated dissipator. These thicknesses are equal to half the thickness of the substrate for a simple stack, for example 100 µm.

$K_1$ and $K_2$: Respective thermal conductivities of the materials in question. $K_1$=0.46 W/cm/° C. for GaAs and $K_2$=4.5 W/cm/° C. for SiC.

N: Number of elementary modules, N=10 for example.

With these data, and in the case of a simple stack, $\Delta T_m$=1.3° C. is obtained, which is negligible compared to the amplitude of the thermal transient considered next.

Transient Temperature

Figure 9:
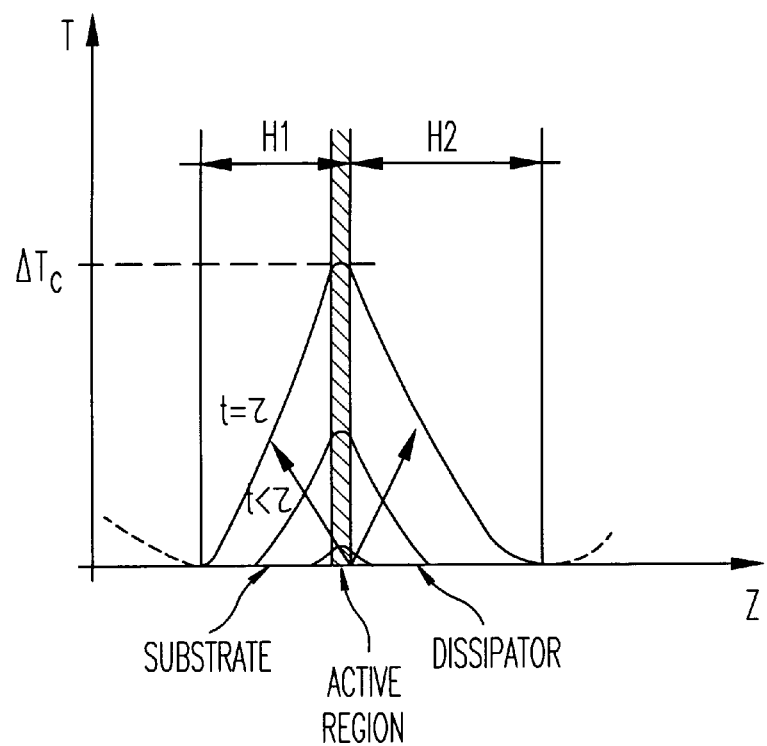
FIG. 9 represents a change in the temperature in a laser diode hybrid module during a pulse of duration $\tau$.

For the duration of an excitation pulse, a transient profile is added to the previous mean profile, which transient profile changes with time as shown in FIG. 9, which represents one period of the periodic structure constituted by the stack. So long as the thicknesses of the materials are greater than the thermal diffusion lengths:

$$\text{thickness} \geq \sqrt{\frac{\tau K}{\rho C}} \qquad (2)$$

(50 µm for τ=100 µs in GaAs), the materials where the heat flows may be considered as infinite, and the temperature rise $\Delta T_c$ of the active region at the end of a pulse of duration τ is given by:

$$\Delta T_c = 2F\sqrt{(\tau/\pi)} / \left( \sqrt{(K_1 \rho_1 C_1)} + \sqrt{(K_2 \rho_2 C_2)} \right) \qquad (3)$$

K,ρ and C are respectively the thermal conductivity, density and specific heat capacity of the two materials located on either side of the active region. In the case of a simple stack, the materials 1 and 2 are GaAs.

Under the excitation conditions already defined, the following results are obtained:

Simple stack: $\Delta T_c$=12° C., which is a maximum value not to be exceeded;

Hybrid stack with SiC radiator array: $\Delta T_c$=5° C.

The formulae given previously make it possible to optimize the design of a stack (thicknesses, number of arrays, etc.) depending on a particular application, for example the desired emitted power and excitation mode.

For example, a maximum transient temperature value $\Delta T_c$ is fixed. With the aid of formula (3), a pair of values F (heat flux in the active region) and τ (duration of a pulse) is determined. Choosing, for example, a value F, a pulse duration τ is determined. Next, with the aid of formula (2), the minimum thicknesses of the materials enclosing the active region are determined.

$\Delta T_c$ is the minimum peak heating which can be obtained. Reducing the thicknesses of the substrate and of the dissipator below the thermal diffusion length for the desired pulse duration would increase $\Delta T_c$; increasing these thicknesses would not reduce $\Delta T_c$ but would reduce the emitted power density.

By way of example, a stack of 10 elementary arrays (simple modules) is considered, which are arranged according to the techniques of the art and in which the dimensions of each array are as follows:

thickness of the GaAs substrate: 100 µm width: 1 cm length (in the direction of the laser emission): 1 mm emitted optical power: 100 W for a current of 120 A at 2 V In pulsed mode (100 µs, 10 Hz), the mean heating is negligible and the peak heating is 12° C., which is acceptable for a number of applications. The emitted power is 1 kW for an effective area of 0.1 cm².

If structures are considered in which the heat is removed solely via the parts holding the modules by clamping, and via the sides of the modules, the recurrence frequency of the pulses should be limited, for example, towards 100 Hz, for 100 µs pulses and a stack of 10 simple modules.

Structures have been considered in which the heat is removed solely via the parts holding the modules by clamping. This limits the recurrence frequency of the pulses towards 100 Hz, for 100 µs pulses and a stack of 10 simple modules.

Hybrid modules may also be designed, in which the dissipator is longer than the monolithic array and whose rear part extends beyond the stack and acts as a fin cooled by circulation and/or vaporization of fluid (FIG. 3). This type of structure does not substantially reduce the transient heating, which is limited by the heat transport perpendicular to the plane of the modules, but it makes it possible to improve the mean cooling. A choice may be made:

either to increase the recurrence frequency;

or to increase the number of modules in the stack, in comparison to the values in the example chosen.

Figure 10:
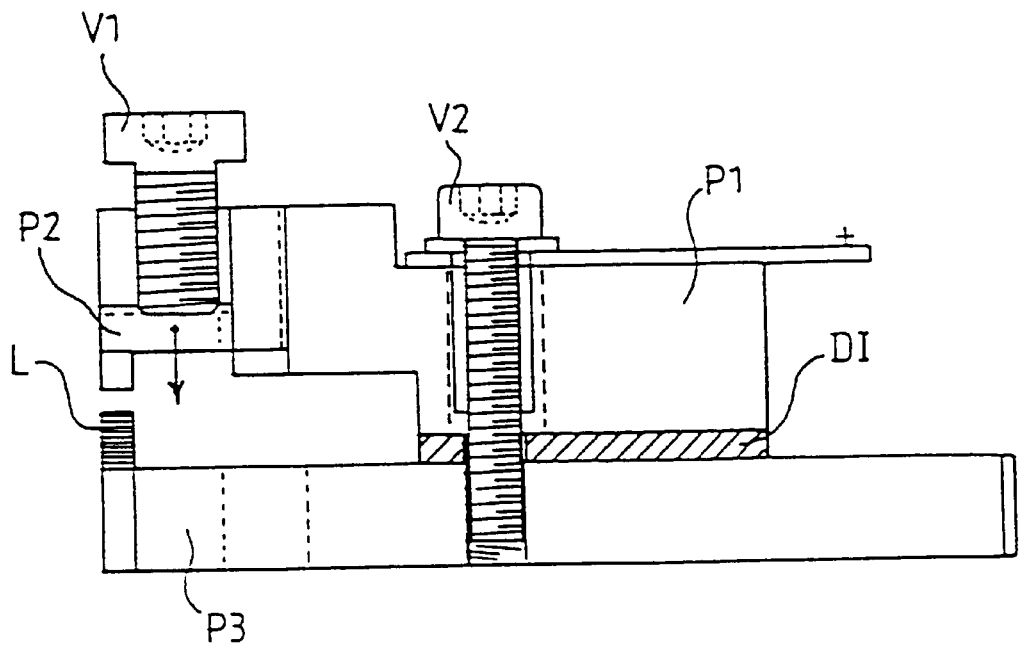
FIG. 10 represents an illustrative embodiment of a mounting for a stack of laser diodes according to the invention.

A device making it possible to clamp a stack was produced as represented in FIG. 10.

Figure 6:
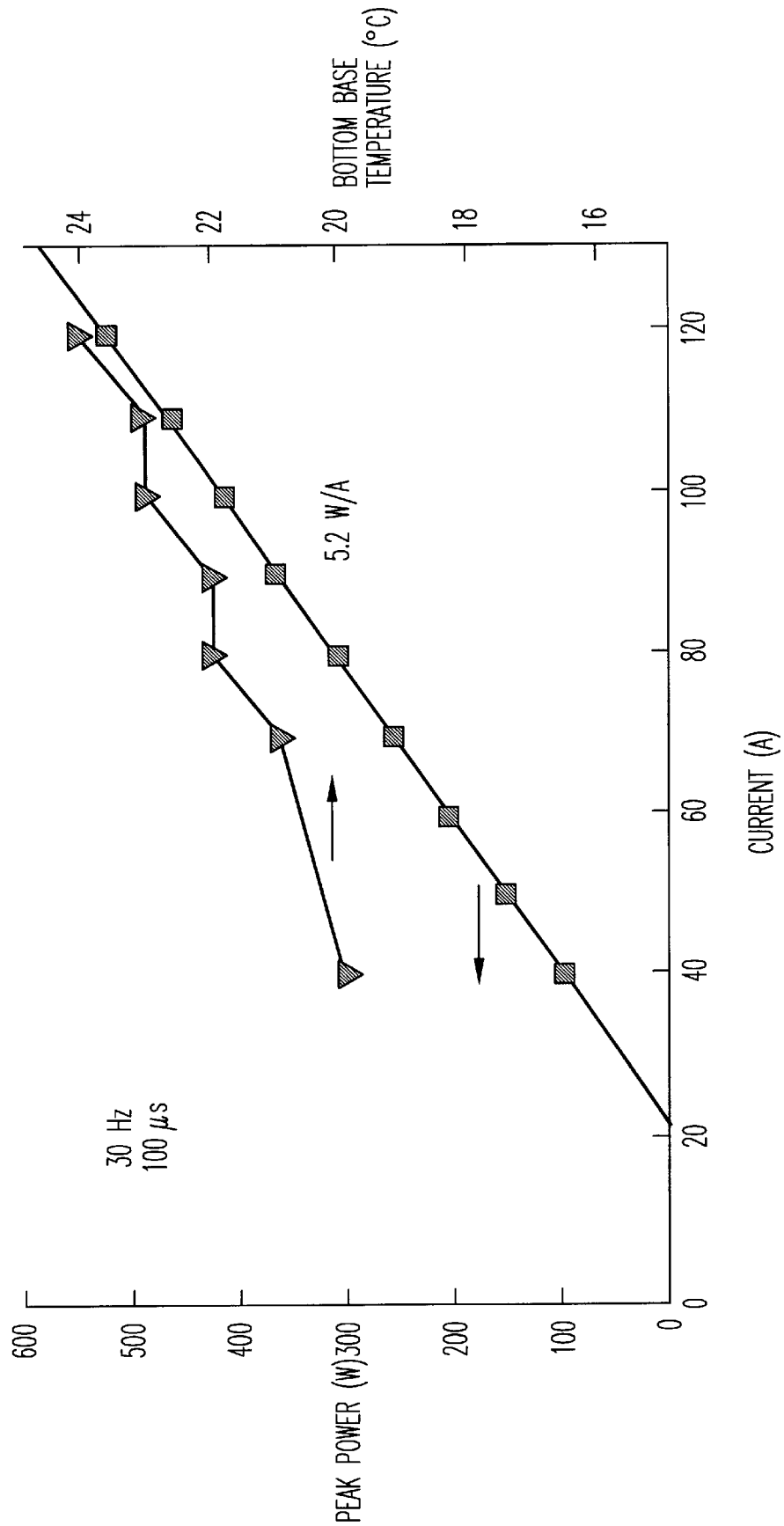
FIG. 6 represents curves of variation, as a function of the injected current, of the peak power of the diode and of the bottom based temperature.
Figure 7:
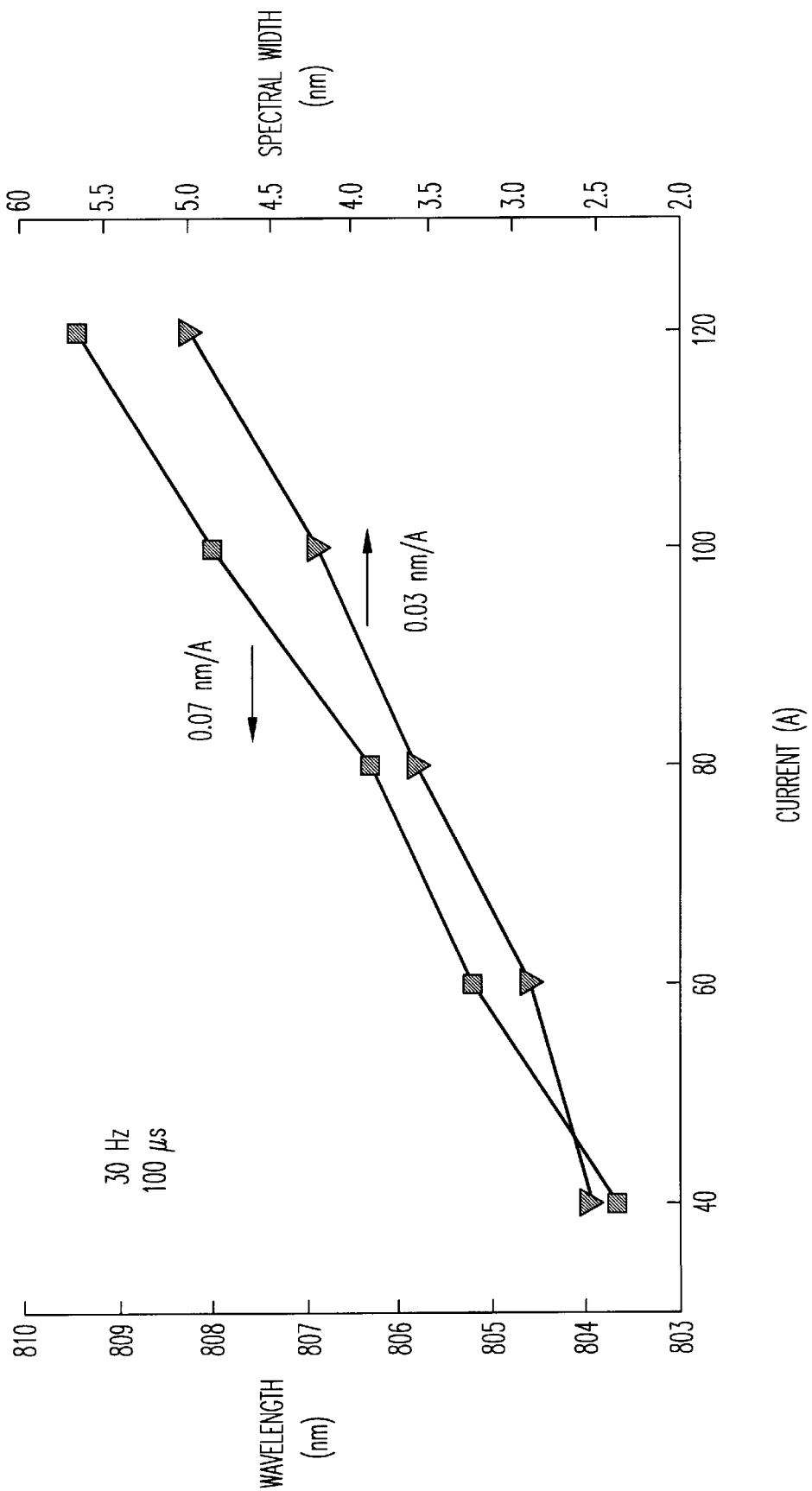
FIG. 7 represents curves, as a function of the injected current, of the wavelength of the light emitted by the diode and of the spectral width.

The characteristics of a stack of 5 arrays are given in FIGS. 6 and 7, which respectively show, for a 100 µs pulse mode at 30 Hz;

the P/I characteristic (emitted power as a function of injected current)

the change in the spectral width as a function of the injected current.

These curves indeed satisfy the orders of magnitude evaluated above.

It includes a base P3 on which a laser diode stack L is placed. A fastening part P2 slides on a fixed part P1 and, with the aid of a screw, makes it possible to fasten the stack L. The fixed part P1 is fixed to the base P3 by a screw V2, and is insulated from the base P3 by an insulating plate DI.

Figure 11:
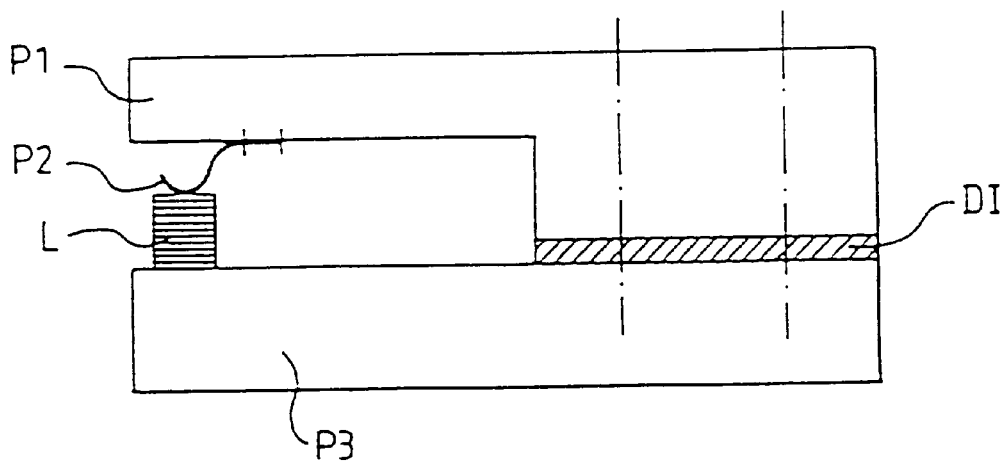
FIG. 11 represents an alternative embodiment according to the invention.

FIG. 11 represents a simplified alternative embodiment, in which the fastening part P2 is a spring, which is fixed to the fixed part P1 and compresses the diode stack L against the base P3. The fixed part P1 is fixed to the base P3 by an insulating sheet DI.

We claim:

1. Semiconductor laser source, including:

a stack of semiconductor laser diodes, each including at least one active region located between an ohmic contact layer and a substrate which also assumes the function of an ohmic contact layer; and a pressure device configured to keep the diodes in contact with one another so that their ohmic contact layers are in direct contact with one another.

2. Laser source according to claim 1, wherein the substrate comprises a material characterized by a thermal diffusion length and has thickness greater than or equal to the thermal diffusion length.

3. Laser source according to claim 2, wherein the thermal diffusion length is given by:

$$\sqrt{\frac{\tau K}{\rho C}};$$

τ being the duration of a pulse;

K, ρ and C being respectively the thermal conductivities, density and specific heat capacity of the substrate.

4. Laser source according to claim 1, wherein for a value of a rise in temperature $\Delta T_c$ occurring at an active region upon application of a pulse to said diodes, one of the values of a pair of parameters F and τ is determined as follows:

$$\Delta T_c = 2F\sqrt{(\tau/\pi)} / \left( \sqrt{(K_1 \rho_1 C_1)} + \sqrt{(K_2 \rho_2 C_2)} \right)$$

in which:

F: peak heat flux generated in the active region of each diode

τ: duration of the current pulse $K_1$ and $K_2$, $\rho_1$ and $\rho_2$, $C_1$ and $C_2$: respectively the thermal conductivities, densities and specific heat capacities of materials enclosing the active region;

then, on the basis of the value of one parameter F or $\tau$, the value of the other parameter is determined; the value of $\tau$ making it possible to determine the thickness of the materials enclosing the active region of a diode.

5. Laser source according to claim 1, wherein the active region is based on GaAs.

6. Laser source according to claim 1, wherein the pressure device comprises two pressure parts electrically insulated from one another and mechanically coupled, one of them being mobile relative to the other.

7. Laser source according to claim 1, wherein the ohmic contact layers are supplemented with electrolytic gold.

8. Laser source according to claim 1, wherein the stack of laser diodes is free from solder or brazing agent.

9. Laser source according to claim 1, wherein thicknesses of materials located on either side of the active region of each diode are less than respective thermal diffusion lengths in the materials.

10. Laser source, including:
a stack of semiconductor laser diodes, each including at least one active region located between an ohmic contact layer and a substrate which also assumes the function of an ohmic contact layer; and
a pressure device configured to keep the diodes in contact with one another via their ohmic contact layers;
wherein for a maximum value $\Delta T_m$ of heating occurring at a center of the stack of laser diodes upon application of current pulses thereto, the number N of stacked diodes is given by the formula:

$$\Delta T_m = F\tau f(H/K)N(N+2)/8$$

with:
F: peak heat flux generated in the active region of each diode;
$\tau$: duration of the current pulses;
f: repetition frequency of the current pulses;
H: thickness of the substrate;
K: thermal conductivity of the substrate;
N: number of stacked diodes.

11. Laser source comprising:
a stack of semiconductor laser diodes including an active region and an electrically conductive substrate;
a pressure device configured to keep the diodes in contact with one another; and
a semiconductor thermal dissipation sheet located between each diode, said dissipation sheet having a high thermal conductivity, being electrically conductive, and having an area in the plane of the diodes greater than that of the diodes;
wherein the thicknesses of the materials located on either side of the active region of each diode are greater than or equal to the thermal diffusion length in each material.

12. Laser source according to claim 11, wherein the thermal dissipation sheet is made of SiC or Si.

13. Laser source according to claim 11, wherein the thermal diffusion length in each material is given by:

$$\sqrt{\frac{\tau K}{\rho C}};$$

$\tau$ being the duration of a pulse;
K, $\rho$ and C being respectively the thermal conductivities, density and specific heat capacity of the materials.

14. Laser source according to claim 11, wherein for a value of a rise in temperature $\Delta T_c$ occurring at an active region upon application of a pulse to said diodes, one of the values of a pair of parameters F and $\tau$ is determined as follows:

$$\Delta T_c = 2F\sqrt{(\tau/\pi)} / \left(\sqrt{(K_1\rho_1 C_1)} + \sqrt{(K_2\rho_2 C_2)}\right)$$

in which:
F: peak heat flux generated in the active region of each diode
$\tau$: duration of the current pulse
$K_1$ and $K_2$, $\rho_1$ and $\rho_2$, $C_1$ and $C_2$: respectively the thermal conductivities, densities and specific heat capacities of the materials enclosing the active region;
then, on the basis of the value of one parameter F or $\tau$, the value of the other parameter is determined; the value of $\tau$ making it possible to determine the thicknesses of the materials enclosing the active region of a diode.

15. Laser source comprising:
a stack of semiconductor laser diodes including an active region and an electrically conductive substrate;
a pressure device configured to keep the diodes in contact with one another; and
a semiconductor thermal dissipation sheet located between each diode, said dissipation sheet having a high thermal conductivity, being electrically conductive, and having an area in the plane of the diodes greater than that of the diodes;
wherein for a maximum value $\Delta T_m$ of heating occurring at a center of the stack of diodes upon application of current pulses thereto, the number N of stacked diodes is given by the formula:

$$\Delta T_m = F\tau f(H_1/K_1 + H_2/K_2)N(N+2)/8$$

with:
F: peak heat flux generated in the active region of each diode;
$\tau$: duration of the current pulses;
f: repetition frequency the current pulses;
$H_1$, $H_2$: respective thicknesses of a diode and of a thermal dissipation sheet;
$K_1$, $K_2$: respective thermal conductivities of the materials of the diode and of the thermal dissipation sheet;
N: number of stacked diodes.

16. A semiconductor laser source comprising:
a stack of semiconductor laser diodes including an active region and an electrically conductive substrate;
a pressure device configured to keep the diodes in contact with one another; and
a semiconductor thermal dissipation sheet located between each diode, said dissipation sheet being thermally and electrically conductive, and having an area in the plane of the diodes greater than that of the diodes;

wherein the substrate comprises a material characterized by a substrate thermal diffusion length and has a thickness greater than or equal to the substrate thermal diffusion length; and the dissipation sheet comprises a material characterized by a dissipation sheet thermal diffusion length and has a thickness greater than or equal to the dissipation sheet thermal diffusion length.

17. Laser source according to claim 16, wherein for a value of a rise in temperature $\Delta T_c$ occurring at an active region upon application of a pulse to said diodes, one of the values of a pair of parameters F and $\tau$ is determined as follows:

$$\Delta T_c = 2F\sqrt{(\tau/\pi)} / \left(\sqrt{(K_1\rho_1C_1)} + \sqrt{(K_2\rho_2C_2)}\right)$$

in which:
- F: peak heat flux generated in the active region of each diode
- $\tau$: duration of the current pulse
- $K_1$ and $K_2$, $\rho_1$ and $\rho_2$, $C_1$ and $C_2$: respectively the thermal conductivities, densities and specific heat capacities of the materials enclosing the active region;

then, on the basis of the value of one parameter F or $\tau$, the value of the other parameter is determined; the value of $\tau$ making it possible to determine the thicknesses of the materials enclosing the active region of a diode.

18. A method for optimizing a semiconductor laser source having stacked diodes held together by a pressure device, comprising:

calculating a duration ($\tau$) of a current pulse applied to said stacked diodes using:

$$\Delta T_c = 2F\sqrt{(\tau/\pi)} / \left(\sqrt{(K_1\rho_1C_1)} + \sqrt{(K_2\rho_2C_2)}\right)$$

where $\Delta T_c$ is a rise in temperature in a diode's active region upon application of a current pulse thereto, F is a peak heat flux generated in the active region, $K_1$ and $K_2$ are respectively thermal conductivities of first and second materials enclosing the active region, $\rho_1$, and $\rho_2$ are respectively the densities of the first and second materials, and $C_1$ and $C_2$ are respectively the specific heat capacities of the first and second materials;

calculating respective thermal diffusion lengths $L_1$ and $L_2$ of the first and second materials using:

$$L_1 = \sqrt{\frac{\tau K_1}{\rho_1 C_1}}, \quad L_2 = \sqrt{\frac{\tau K_2}{\rho_2 C_2}}; \text{ and}$$

setting thicknesses of the first and second materials enclosing the active region greater than or equal to the thermal diffusion lengths $L_1$ and $L_2$ of the first and second materials.

19. A method for optimizing a semiconductor laser source as recited in claim 18, wherein the first and second materials are the same material.

20. A method for optimizing a semiconductor laser source as recited in claim 18, wherein the first material comprises GaAs.

21. A method for optimizing a semiconductor laser source as recited in claim 18, wherein the second material comprises Si or SiC.

22. A method for optimizing a semiconductor laser source as recited in claim 18, further comprising:

calculating a number N of stacked diodes using:

$$\Delta T_m = F\tau f(H_1/K_1 + H_2/K_2)N(N+2)/8,$$

where $\Delta T_m$ is a mean rise in temperature occurring at a center of the stack of diodes upon application of current pulses thereto and f is the repetition frequency of the pulses.

* * * * *